United States Patent
Kuribayashi (10) Patent No.: US 9,735,109 B2
(45) Date of Patent: Aug. 15, 2017

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventor: Hidenao Kuribayashi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/336,802

(22) Filed: Oct. 28, 2016

(65) Prior Publication Data

US 2017/0170126 A1 Jun. 15, 2017

(30) Foreign Application Priority Data

Dec. 11, 2015 (JP) ................................. 2015-242472

(51) Int. Cl.

| | |
|---|---|
| H01L 29/12 | (2006.01) |
| H01L 21/00 | (2006.01) |
| H01L 21/16 | (2006.01) |
| H01L 23/532 | (2006.01) |
| H01L 29/45 | (2006.01) |
| H01L 21/768 | (2006.01) |
| H01L 21/02 | (2006.01) |

(52) U.S. Cl.
CPC .. *H01L 23/53266* (2013.01); *H01L 21/02378* (2013.01); *H01L 21/76841* (2013.01); *H01L 21/76895* (2013.01); *H01L 29/45* (2013.01)

(58) Field of Classification Search
CPC ......... H01L 21/76895; H01L 21/02378; H01L 23/53266; H01L 29/45
USPC .............................................. 257/43; 438/104
See application file for complete search history.

(56) References Cited

U.S. PATENT DOCUMENTS

| | | | |
|---|---|---|---|
| 2011/0079777 A1* | 4/2011 | Akimoto | ............. H01L 29/7869 257/43 |
| 2015/0243753 A1* | 8/2015 | Suekawa | ................. H01L 29/45 257/409 |
| 2016/0181376 A1 | 6/2016 | Utsumi et al. | |

FOREIGN PATENT DOCUMENTS

JP H04-264720 A 9/1992

* cited by examiner

*Primary Examiner* — David S Blum (57) ABSTRACT

To restrict the deterioration of properties in a semiconductor device due to hydrogen, provided is a semiconductor device including a semiconductor substrate; a hydrogen absorbing layer that is provided above a top surface of the semiconductor substrate and formed of a first metal having a hydrogen absorbing property; a nitride layer that is provided above the hydrogen absorbing layer and formed of a nitride of the first metal; an alloy layer that is provided above the nitride layer and formed of an alloy of aluminum and a second metal; and an electrode layer that is provided above the alloy layer and formed of aluminum. A pure metal layer of the second metal is not provided between the electrode layer and the nitride layer.

15 Claims, 11 Drawing Sheets

SEMICONDUCTOR DEVICE AND SEMICONDUCTOR DEVICE MANUFACTURING METHOD

The contents of the following Japanese patent application are incorporated herein by reference:

NO. 2015-242472 filed in JP on Dec. 11, 2015.

BACKGROUND

1. Technical Field

The present invention relates to a semiconductor device and a semiconductor device manufacturing method.

2. Related Art

A conventional semiconductor device is known in which electrodes such as source electrodes are formed of aluminum and a barrier metal is provided between these aluminum electrodes and the semiconductor substrate, as shown in Patent Document 1, for example.

Patent Document 1: Japanese Patent Application Publication No. 2012-129503

When an electrode formed of aluminum is placed in a high-temperature environment, there are cases where hydrogen is generated. For example, hydrogen is generated when aluminum reacts with water. When the hydrogen enters into a region near a boundary plane between a gate insulating film and a semiconductor layer, a positive charge is generated at this boundary plane and the threshold voltage fluctuates.

In contrast, there is an idea of forming a hydrogen absorbing metal layer made of titanium, for example, below an aluminum electrode. By having the hydrogen absorbing metal absorb the hydrogen, it is possible to restrict the hydrogen from entering into the region near the boundary plane of the gate insulating film. However, when aluminum and the hydrogen absorbing metal form an alloy, the hydrogen absorption effect is weakened.

SUMMARY

According to a first aspect of the present invention, provided is a semiconductor device comprising a semiconductor substrate, a hydrogen absorbing layer, a nitride layer, an alloy layer, and an electrode layer. The hydrogen absorbing layer may be provided above a top surface of the semiconductor substrate and formed of a first metal having a hydrogen absorbing property. The nitride layer may be provided above the hydrogen absorbing layer and formed of a nitride of the first metal. The alloy layer may be provided above the nitride layer and formed of an alloy of aluminum and a second metal. The electrode layer may be provided above the alloy layer and formed of aluminum. A pure metal layer of the second metal needs not be provided between the electrode layer and the nitride layer.

The first metal may be titanium. The second metal may be one of titanium, molybdenum, tungsten, vanadium, chromium, copper, and nickel. The second metal may be titanium.

Thickness of the alloy layer may be greater than or equal to 15 nm. The thickness of the alloy layer may be less than or equal to 0.5 µm. Thickness of the electrode layer may be less than or equal to 3 µm. The thickness of the electrode layer may be greater than or equal to 1 µm and less than or equal to 2 µm.

The semiconductor device may further comprise a solder layer provided above the electrode layer. The alloy layer may be formed at least in a region opposite the solder layer.

The semiconductor device may further comprise an interlayer insulating film that is provided above a top surface of the semiconductor substrate. An opening that exposes a source region formed on the top surface of the semiconductor substrate may be formed in the interlayer insulating film. The hydrogen absorbing layer, the nitride layer, and the alloy layer may be formed at least above the opening of the interlayer insulating film.

The hydrogen absorbing layer, the nitride layer, and the alloy layer may also be formed in a region along side surfaces of the opening of the interlayer insulating film. The semiconductor substrate may be a silicon carbide substrate.

According to a second aspect of the present invention, provided is a semiconductor device manufacturing method comprising forming a hydrogen absorbing layer that is formed of a first metal having a hydrogen absorbing property above a top surface of a semiconductor substrate; forming a nitride layer that is formed of a nitride of the first metal above the hydrogen absorbing layer; forming a precursor layer that is formed of a second metal above the nitride layer; and forming an alloy layer by forming the aluminum on the precursor layer so as to cause all of the precursor layer to become an alloy with aluminum, and forming an electrode layer made of aluminum on the alloy layer.

The aluminum may be formed at a temperature greater than or equal to 200 degrees Celsius.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
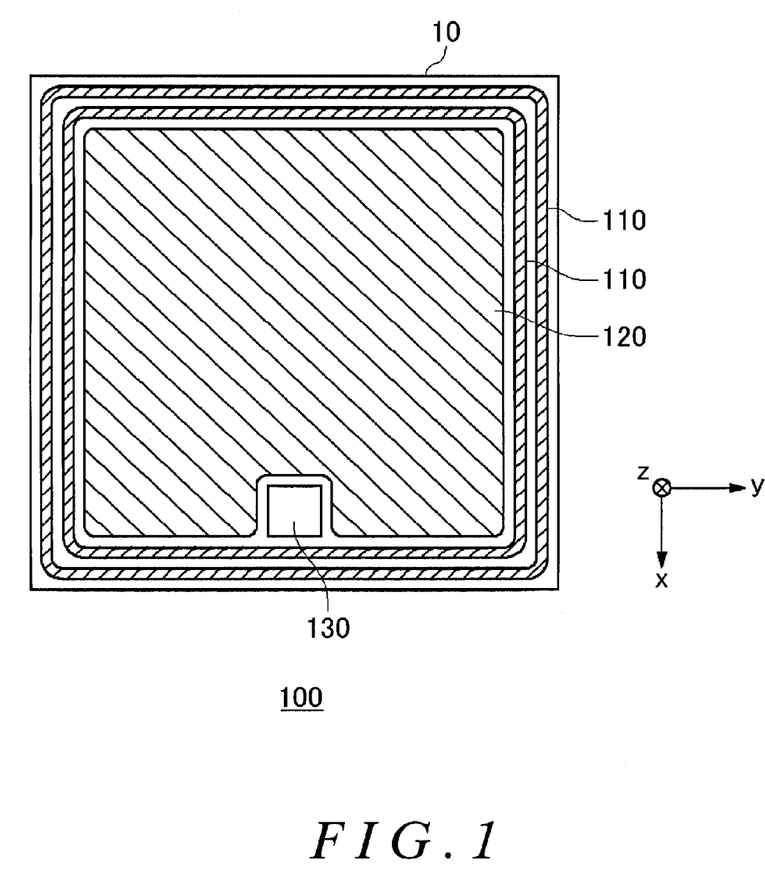
FIG. 1 shows an exemplary structure of a top surface of a semiconductor device 100.

FIG. 1 shows an exemplary structure of a top surface of a semiconductor device 100. In this example, the two directions that are orthogonal to a plane parallel to the top surface of the semiconductor device 100 are referred to as the x direction and the y direction, and a direction orthogonal to the x direction and the y direction is referred to as the z direction. In this Specification, the z direction is also referred to as the depth direction. Relative positional relationships in the z direction can be referred to using the terms "up" and "down." The surfaces of the substrate, each layer, each region, and the like that are upward in the z direction are referred to as the top surfaces, and the surfaces that are downward in the z direction are referred to as the bottom surfaces. The terms "up" and "down" indicate relative positional relationships, and do not necessarily correspond to up and down in the direction of gravity.

The semiconductor device 100 includes a semiconductor substrate 10. The semiconductor substrate 10 is a silicon carbide (SiC) substrate, for example. Instead, the semiconductor substrate 10 may be another type of semiconductor substrate, such as a silicon substrate. An active region 120, a gate pad 130, and an edge termination structure 110 are formed on the semiconductor substrate 10. Semiconductor elements such as an IGBT (Insulated Gate Bipolar Transistor), a MOSFET (Metal Oxide Semiconductor Field Effect Transistor), and an FWD (Free Wheel Diode) are formed in the active region 120.

The gate pad 130 is electrically connected to semiconductor elements and the like in the active region 120, by wiring formed on the semiconductor substrate 10. The gate pad 130 is electrically connected to a circuit outside the semiconductor device 100 by a wire or the like.

An electrode layer that functions as a source electrode is formed above the active region 120, but this electrode layer is not shown in FIG. 1. One or more pins are connected to this electrode layer by solder or the like. The electrode layer is electrically connected to an external circuit by these pins.

The edge termination structure 110 is formed along the edges of the semiconductor substrate 10, in a manner to surround the active region 120. The edge termination structure 110 has a guard ring, a field plate, a RESURF, and a structure formed by combining these components, for example. In this way, the focusing of the electrical field at an end portion of the active region 120 or the like is weakened.

Figure 2:
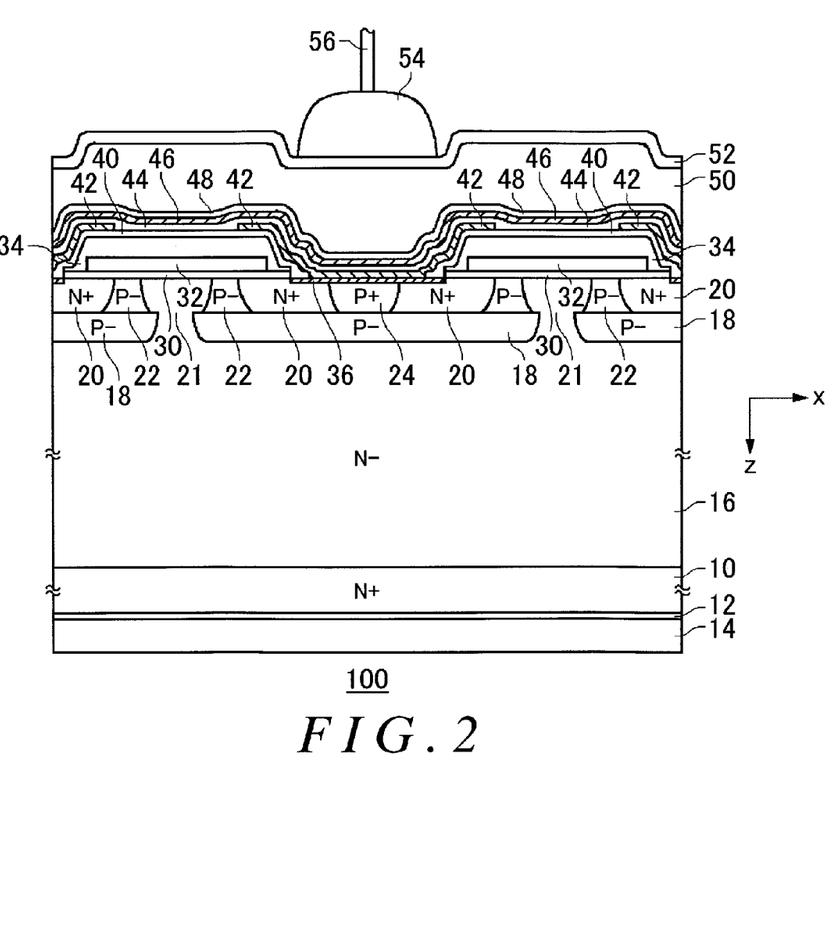
FIG. 2 is a cross-sectional view of the semiconductor device 100 in the active region 120.

FIG. 2 is a cross-sectional view of the semiconductor device 100 in the active region 120. This cross-sectional view is a plane parallel to the x-z plane. In this cross section, a vertical MOSFET is formed. The semiconductor substrate 10 of this example is an N+ type substrate.

An N− type drift layer 16 with a lower concentration than the semiconductor substrate 10 is formed on top of the semiconductor substrate 10. The drift layer 16 of this example is an SiC epitaxial layer doped with N type impurities such as nitrogen.

A P− type well region 18 is selectively formed on the top surface side of the drift layer 16. Specifically, the well region 18 is formed with a prescribed pattern on a top surface side of the drift layer 16, such that a portion of the drift layer 16 remains. The well region 18 is formed by implanting P type impurities into a prescribed region of the top surface of the drift layer 16, for example.

A P− type base layer 22 is formed on top of the well region 18 and the drift layer 16. The base layer 22 of this example is an SiC epitaxial layer doped with P type impurities such as aluminum. An N− type drift region 21 is formed in a region of the base layer 22 that is opposite the drift layer 16. The drift region 21 is formed by doping a prescribed region of the base layer 22 with N type impurities such as nitrogen.

An N+ type source region 20 is formed in a partial region of the base layer 22. The source region 20 is formed by doping a prescribed region of the base layer 22 with N type impurities such as phosphorous. Furthermore, a P+ type contact region 24 is formed in a partial region of the source region 20. The contact region 24 is formed by implanting P type impurities such as nitrogen into a prescribed region of the source region 20.

A silicide region 36 is formed in upper portions of the source region 20 and the contact region 24. The silicide region 36 is formed of nickel silicide, for example. In this way, it is possible for the source region 20 and the contact region 24 to realize ohmic contact with electrodes in the upper portion.

A gate insulating film 30 and a gate electrode 32 are formed in the region opposite the base layer 22. The gate electrode 32 is formed of polysilicon, for example. The gate insulating film 30 is provided below the gate electrode 32. The gate insulating film 30 is formed by oxidizing the top surface of the semiconductor layer, for example.

The gate insulating film 30 and the gate electrode 32 are formed at least from a position opposite an end of the source region 20 to a position opposite an end of the drift region 21. In this way, a channel is formed in the base layer 22 according to the voltage applied to the gate electrode 32.

The interlayer insulating film 34 is formed in a manner to cover the gate insulating film 30 and the gate electrode 32. However, the gate insulating film 30, the gate electrode 32, and the interlayer insulating film 34 are formed such that at least a portion of the contact region 24 and the source region 20 remain uncovered. In this example, at least a portion of the silicide region 36 formed in the upper portions of the contact region 24 and the source region 20 is left exposed without being covered by the gate insulating film 30 and the like.

A titanium nitride layer 40 (TiN) is formed on top of the interlayer insulating film 34. The titanium nitride layer 40 covers the entire top surface and side surfaces of the interlayer insulating film 34. The side surfaces of the interlayer insulating film 34 are the surfaces of the interlayer insulating film 34 between the top surface of the interlayer insulating film 34 that is parallel to the x-y plane and the top surface of the semiconductor layer that is parallel to the x-y plane. In other words, the side surfaces of the interlayer insulating film 34 are the surfaces of the interlayer insulating film 34 that are not parallel to the x-y plane. The titanium nitride layer 40 is formed on a partial region of the silicide region 36 (or the source region 20). However, the titanium nitride layer 40 is formed such that at least a portion of the silicide region 36 remains uncovered.

A nickel layer 42 is formed on top of the silicide region 36. The nickel layer 42 may be formed on a partial region of the titanium nitride layer 40 as well. However, the nickel layer 42 is formed such that at least a portion of the titanium nitride layer 40 remains uncovered. The nickel layer 42 of this example does not cover the titanium nitride layer 40 on at least a partial region thereof that is opposite the gate electrode 32.

A hydrogen absorbing layer 44 is formed of a first metal that has a hydrogen absorbing property, on top of the nickel layer 42 and the portion of the titanium nitride layer 40 that is not covered by the nickel layer 42. In this example, the first metal is titanium. However, the first metal is not limited to being titanium, and may be any metal that has a hydrogen absorbing property and can function as an electrode.

A hydrogen absorbing property refers to a quality of being able to absorb hydrogen into a solid metal. A hydrogen absorbing metal safely absorbs hydrogen into a solid by absorbing the hydrogen between the metal particles or by replacing the metal particles with the hydrogen, for example. By providing the hydrogen absorbing layer 44, it is possible to restrict the hydrogen that is generated above the hydrogen absorbing layer 44 from moving to the gate insulating film 30 and the semiconductor layer that are lower than the hydrogen absorbing layer 44. Therefore, it is possible to restrict deterioration of the gate insulating film 30. Furthermore, it is possible to restrict the generation of positive charge at the boundary plane between the semiconductor layer and the gate insulating film 30, and to restrict fluctuations in the threshold value of the semiconductor device 100.

A nitride layer 46 that is formed of a nitride of the first metal is formed above the hydrogen absorbing layer 44. The nitride layer 46 of this example is a titanium nitride layer. The nitride layer 46 is formed to cover the entire top surface of the hydrogen absorbing layer 44. The nitride layer 46 prevents the hydrogen absorbing layer 44 from becoming an alloy with the electrode material in the upper portion. When the hydrogen absorbing layer 44 becomes an alloy, the hydrogen absorbing property is weakened, but by providing the nitride layer 46, it is possible to maintain the hydrogen absorbing property of the hydrogen absorbing layer 44.

An alloy layer 48 formed of an alloy including aluminum and a second metal is formed above the nitride layer 46. The second metal may be the same as the first metal, or may different from the first metal. In this example, the second metal is titanium. However, the second metal is not limited to being titanium, and can be any metal that is capable of forming an alloy with a greater hardness than aluminum as a result of becoming an alloy with aluminum and also capable of enabling the alloy layer 48 to function as a portion of an electrode. The second metal is one of titanium, molybdenum, tungsten, vanadium, chromium, copper, and nickel, for example.

The alloy layer 48 is formed at least in a range opposite an opening portion of the interlayer insulating film 34. The opening portion of the interlayer insulating film 34 refers to a portion that is not covered by the interlayer insulating film 34. The alloy layer 48 is preferably also formed in a range opposite the side surfaces of the interlayer insulating film 34. In this example, the alloy layer 48 is formed on the entire top surface of the nitride layer 46. The hydrogen absorbing layer 44 and the nitride layer 46 are formed above the opening of the interlayer insulating film 34. The hydrogen absorbing layer 44 and the nitride layer 46 are also formed in a range along the side surfaces of the opening of the interlayer insulating film 34.

By providing the alloy layer 48 with a greater hardness than aluminum, it is possible to restrict the stress generated by the aluminum above the alloy layer 48 from being transferred below the alloy layer 48. Therefore, it is possible to restrict warping in the metal layer below the alloy layer 48, and this metal layer can be restricted from peeling away from the semiconductor region or the interlayer insulating film 34.

The electrode layer 50 is formed above the alloy layer 48. The electrode layer 50 is formed of aluminum. The electrode layer 50 may be formed on the entire top surface of the alloy layer 48. The electrode layer 50 preferably has a thickness that enables the thickness differences caused by the interlayer insulating film 34 and the like to be evened out. The thickness difference on the top surface of the electrode layer 50 is less than the thickness difference of the top surface of the semiconductor layer, i.e. the thickness difference caused by the interlayer insulating film 34 and the like.

A plating layer 52 is formed on top of the electrode layer 50. The plating layer 52 is formed of nickel, for example. Pins 56 are connected to the top surface of the plating layer 52 by a solder layer 54. The pins 56 are electrically connected to a circuit outside of the semiconductor device 100. A source voltage is applied to the electrode layer 50 via the pins 56.

The solder layer 54 is formed in a groove in the top surface of the electrode layer 50, for example. In this case, the solder layer 54 is arranged at a position opposite the opening of the interlayer insulating film 34. A protective film that has an opening in the region where the solder layer 54 is to be formed may be formed on the top surface of the electrode layer 50. After the solder layer 54 has been formed and fused to the top surface of the plating layer 52, the temperature of the solder layer 54 is reduced to room temperature. At this time, stress occurs in the electrode layer 50 opposite the solder layer 54 due to the difference in thermal expansion coefficients between the solder layer 54 and the electrode layer 50.

Specifically, stress in a direction causing the electrode layer 50 to contract in the x-y plane occurs in the electrode layer 50 in the region opposite the solder layer 54. To deal with this, the semiconductor device 100 includes the alloy layer 48, and therefore it is possible to restrict the transfer of this stress to the metal layer in contact with the interlayer insulating film 34, as described above. The alloy layer 48 is preferably formed at least in the region opposite the solder layer 54.

In order to reduce the thickness difference of the top surface of the electrode layer 50, the electrode layer 50 is preferably formed using a high-temperature process. For example, the electrode layer 50 is formed at a temperature greater than or equal to 200 degrees Celsius. The electrode layer 50 may be formed at a temperature greater than or equal to 300 degrees Celsius. The electrode layer 50 may be formed at a temperature less than or equal to 400 degrees Celsius. This temperature may be increased according to the semiconductor device 100 being made finer. The electrode layer 50 may be formed using high-temperature reflow sputtering.

By forming the electrode layer 50 at a high temperature, it is possible to improve the coverage of the electrode layer 50. Furthermore, since the semiconductor device 100 includes the nitride layer 46 between the hydrogen absorbing layer 44 and the electrode layer 50, even when the electrode layer 50 is formed at a high temperature it is possible to prevent the hydrogen absorbing layer 44 and the electrode layer 50 from forming an alloy.

A pure metal layer made of the second metal (titanium in this example) is not provided between the electrode layer 50 and the nitride layer 46. In this example, the alloy layer 48 is formed in contact with the nitride layer 46, and the electrode layer 50 is formed in contact with the alloy layer 48.

The alloy layer 48 can be formed by creating an alloy between the second metal layer formed on top of the nitride layer 46 and the aluminum of the electrode layer 50. By forming the electrode layer 50 at a high temperature, all of the second metal formed on top of the nitride layer 46 becomes an alloy with the aluminum.

In this example, a first electrode layer 12 and a second electrode layer 14 are formed on the bottom surface of the semiconductor substrate 10. The first electrode layer 12 is an electrode formed by layering nickel and titanium, for example, and is formed on the bottom surface of the semiconductor substrate 10. The second electrode layer 14 is an electrode formed by layering titanium, nickel, and gold, for example, and is formed on the bottom surface of the first electrode layer 12. The first electrode layer 12 and second electrode layer 14 of this example function as a drain electrode.

Figure 3:
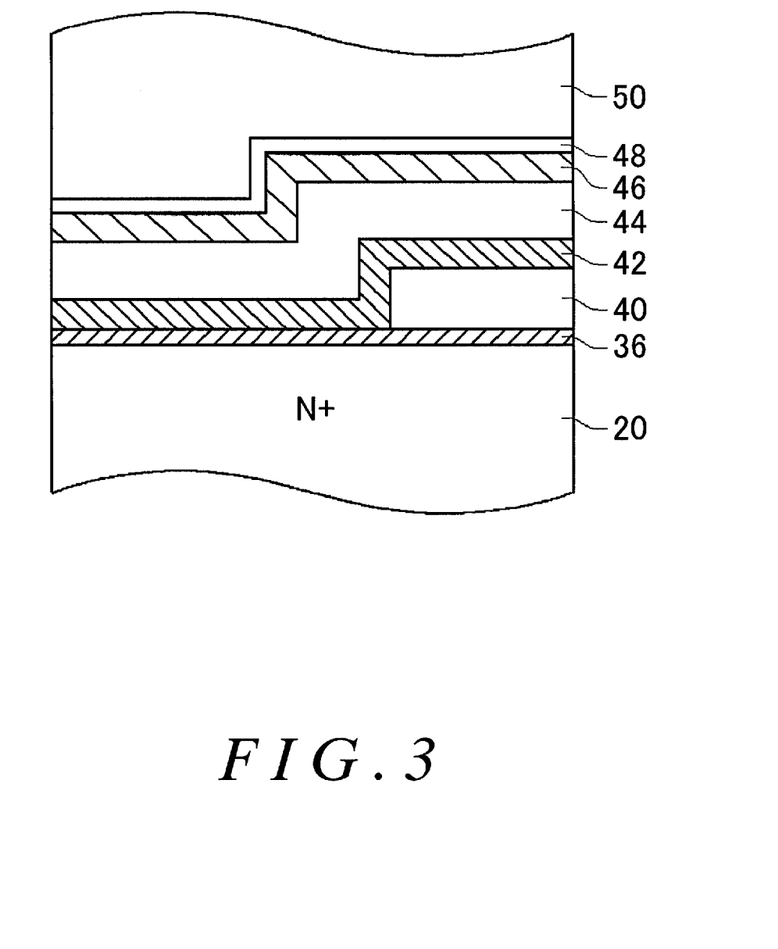
FIG. 3 is a schematic view of each electrode layer provided above the source region 20.

FIG. 3 is a schematic view of each metal layer provided above the source region 20. In this example, the thickness of the titanium nitride layer 40 is greater than or equal to 50 nm and less than or equal to 200 nm. The thickness of the titanium nitride layer 40 is 100 nm, for example. The thickness of the interlayer insulating film shown in FIG. 2 is approximately 1 μm, and the thickness of the gate electrode 32 is approximately 500 nm.

The thickness of the nickel layer 42 is greater than or equal to 30 nm and less than or equal to 100 nm. The nickel layer 42 may be thinner than the titanium nitride layer 40. The thickness of the nickel layer 42 is 60 nm, for example.

In this example, the thickness of the hydrogen absorbing layer 44 is greater than or equal to 50 nm and less than or equal to 200 nm. The thickness of the hydrogen absorbing layer 44 may be approximately equal to the thickness of the titanium nitride layer 40. The thickness of the hydrogen absorbing layer 44 is 100 nm, for example.

In this example, the thickness of the nitride layer 46 is greater than or equal to 50 nm and less than or equal to 200 nm. The thickness of the nitride layer 46 may be approximately equal to the thickness of the hydrogen absorbing layer 44. Instead, the nitride layer 46 may be thinner than the hydrogen absorbing layer 44. The nitride layer 46 need only prevent the hydrogen absorbing layer 44 from forming an alloy with the aluminum when the electrode layer 50 is being formed. The thickness of the nitride layer 46 is 100 nm, for example.

In this example, the thickness of the alloy layer 48 is greater than or equal to 15 nm and less than or equal to 0.5 μm. If the thickness of the alloy layer 48 is less than 15 nm, the strength of the alloy layer 48 is reduced and peeling of the metal layer occurs due to the solder stress. If the thickness of the alloy layer 48 is greater than 0.5 μm, the effect of restricting the peeling of the metal layer is not significantly improved and the thickness of the semiconductor device 100 undesirably increases.

The alloy layer 48 may be thinner than the nitride layer 46. The thickness of the alloy layer 48 may be greater than or equal to 50 nm, or may be greater than or equal to 100 nm. The thickness of each metal layer may be the average thickness in a flat region. The thickness of each metal layer in a region that does not overlap with the interlayer insulating film 34 may be used as the thickness of each metal layer.

In this example, the thickness of the electrode layer 50 is less than or equal to 3 μm. Since the semiconductor device 100 includes the nitride layer 46, the electrode layer 50 can be formed using a high-temperature process. Therefore, even when the electrode layer 50 is relatively thin, it is possible to improve the coverage. The thickness of the electrode layer 50 may be less than or equal to 2 μm.

It should be noted that, if the electrode layer 50 is too thin, there could be cases where all of the aluminum forms an alloy with the second metal such as titanium and a pure aluminum electrode layer 50 cannot be formed, due to manufacturing variations. In such a case, it is difficult to form the plating layer 52. Therefore, the thickness of the electrode layer 50 is preferably greater than or equal to 1 μm.

The plating layer 52 formed on the top surface of the electrode layer 50 may be thicker than the electrode layer 50. In this example, the thickness of the plating layer 52 is 5 μm.

Figure 4A:
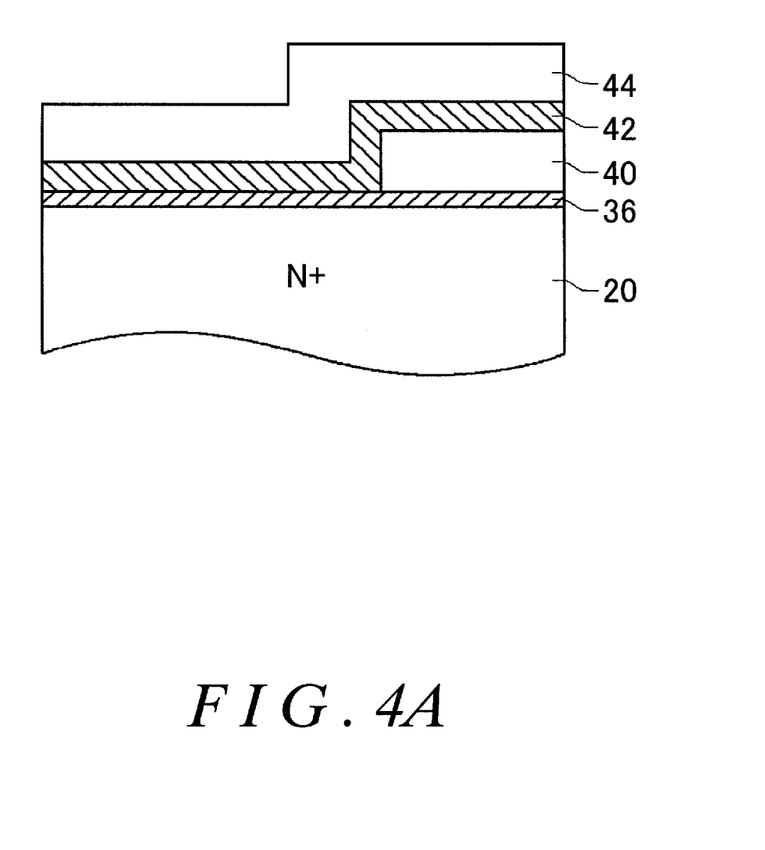
FIG. 4A is a drawing for describing a step of forming a metal layer.
Figure 4B:
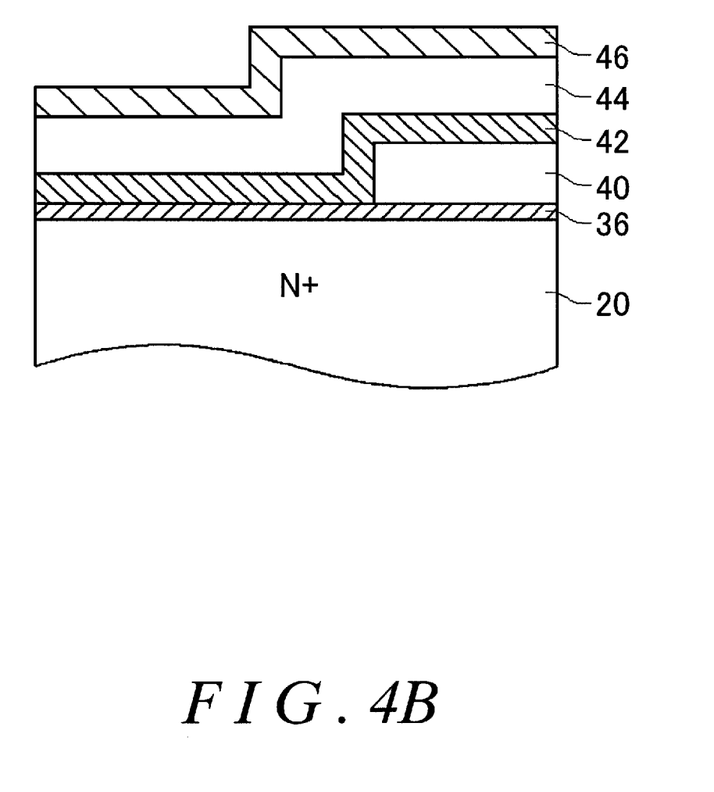
FIG. 4B is a drawing for describing a step of forming a metal layer.

FIGS. 4A to 4D are drawings for describing the steps of forming each metal layer. The temperature of the semiconductor substrate 10 during the formation of each metal layer is 250 degrees Celsius, for example. As shown in FIG. 4A, the titanium nitride layer 40 is selectively formed above the semiconductor substrate 10. The nickel layer 42 is formed above the semiconductor substrate 10 on which the titanium nitride layer 40 has been formed. As shown in FIG. 4B, the hydrogen absorbing layer 44 is formed above the semiconductor substrate 10 on which the nickel layer 42 has been formed. The nitride layer 46 is formed above the hydrogen absorbing layer 44.

Figure 4C:
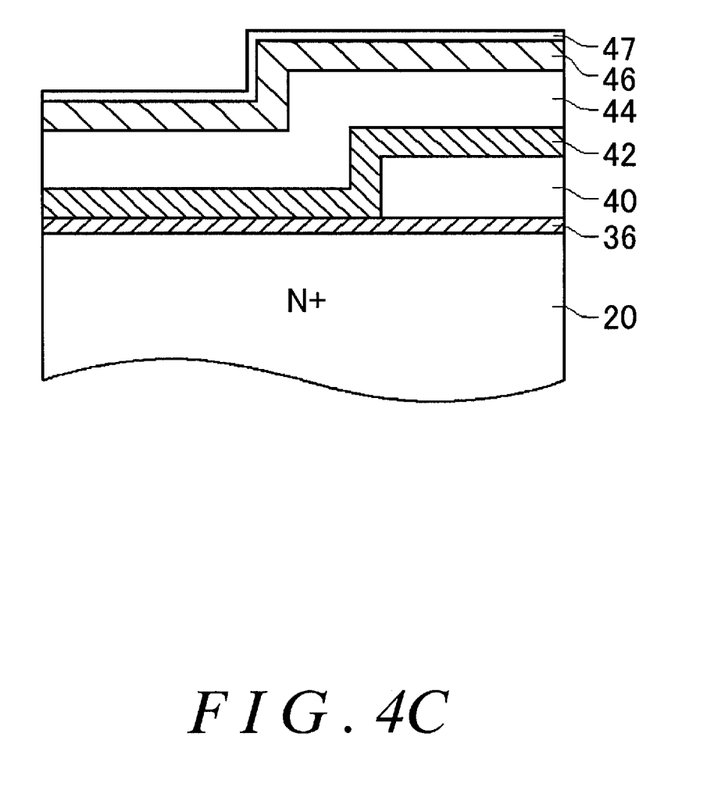
FIG. 4C is a drawing for describing a step of forming a metal layer.
Figure 4D:
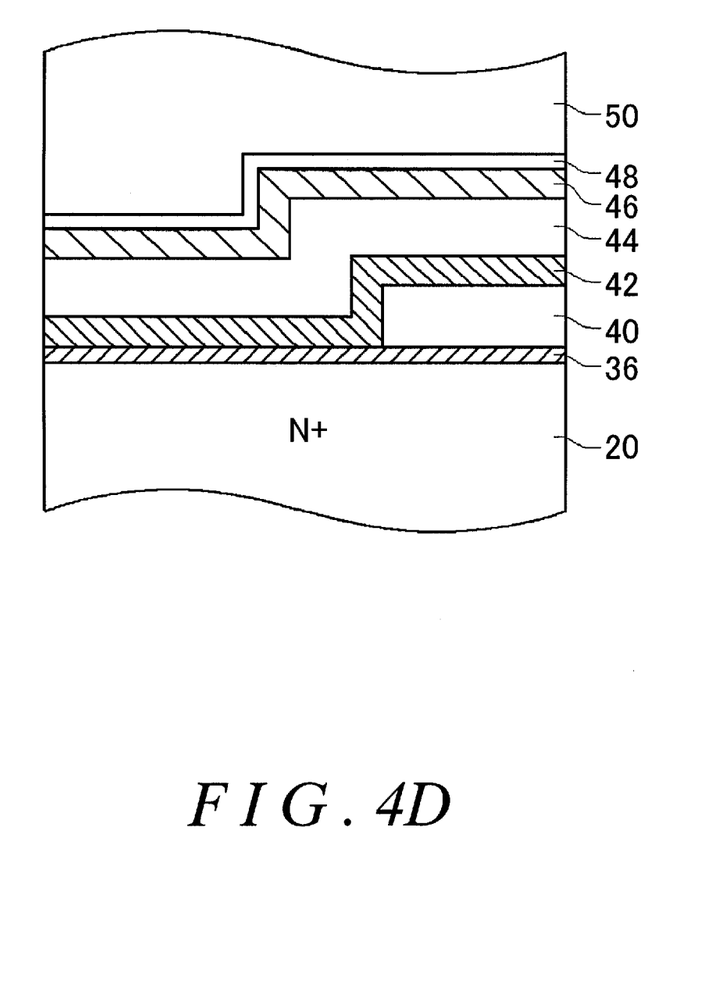
FIG. 4D is a drawing for describing a step of forming a metal layer.

Next, as shown in FIG. 4C, a precursor layer 47 formed of the second metal, such as titanium, is formed above the nitride layer 46. The thickness of the precursor layer 47 may be greater than or equal to 10 nm and less than or equal to 0.25 μm. Aluminum is then formed on top of the precursor layer 47, using a high-temperature process at approximately 250 degrees Celsius. In this way, as shown in FIG. 4D, the electrode layer 50 having high coverage is formed. Furthermore, the entire precursor layer 47 forms an alloy with the aluminum, thereby forming the alloy layer 48. As a result of these steps, it is possible to form the electrode layer 50 having high coverage without weakening the hydrogen absorbing property of the hydrogen absorbing layer 44. Furthermore, it is possible to increase the resistance to solder stress due to the alloy layer 48.

Figure 5:
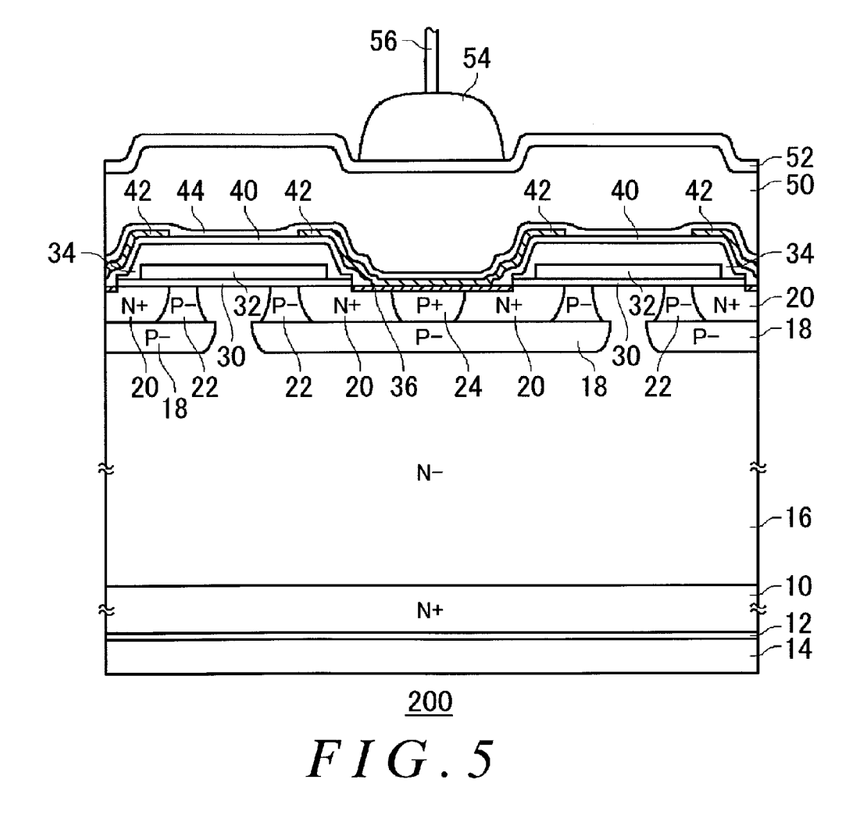
FIG. 5 is a cross-sectional view of a semiconductor device 200 according to a comparative example.

FIG. 5 is a cross-sectional view of a semiconductor device 200 according to a comparative example. The semiconductor device 200 has a different configuration than the semiconductor device 100, by not including the nitride layer 46 and the alloy layer 48. The remaining configuration of the semiconductor device 200 is the same as that of the semiconductor device 100.

Figure 6A:
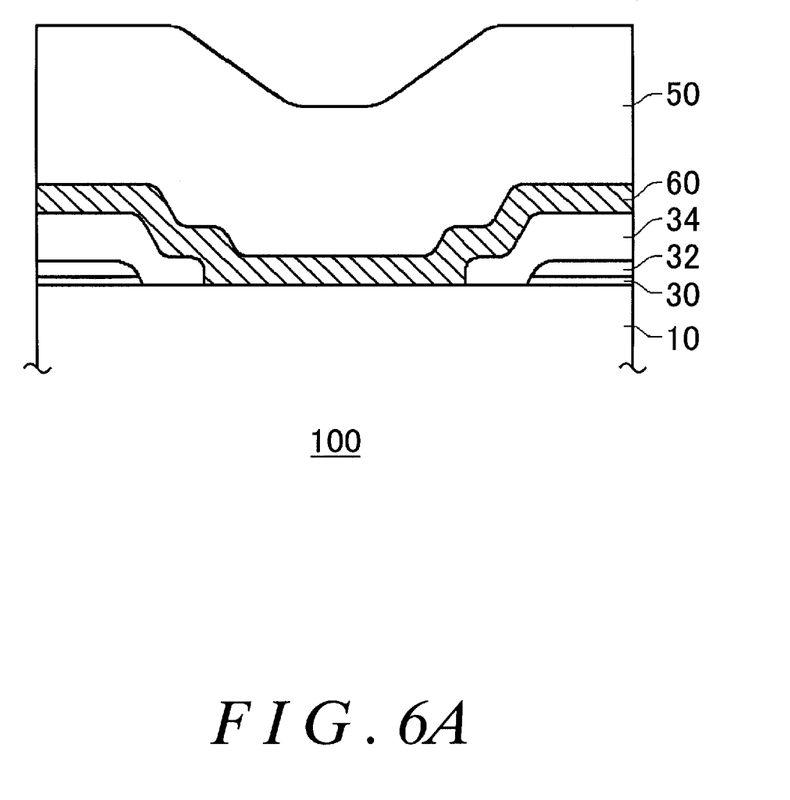
FIG. 6A is a schematic view showing the shape of the electrode layer 50 of the semiconductor device 100.

FIG. 6A is a schematic view showing the shape of the electrode layer 50 of the semiconductor device 100. In FIG. 6A, the titanium nitride layer 40, the nickel layer 42, the hydrogen absorbing layer 44, the nitride layer 46, and the alloy layer 48 are collectively referred to as the metal layer 60. As described above, the electrode layer 50 of the semiconductor device 100 can be formed with a high-temperature process, and therefore it is possible to improve the coverage.

Figure 6B:
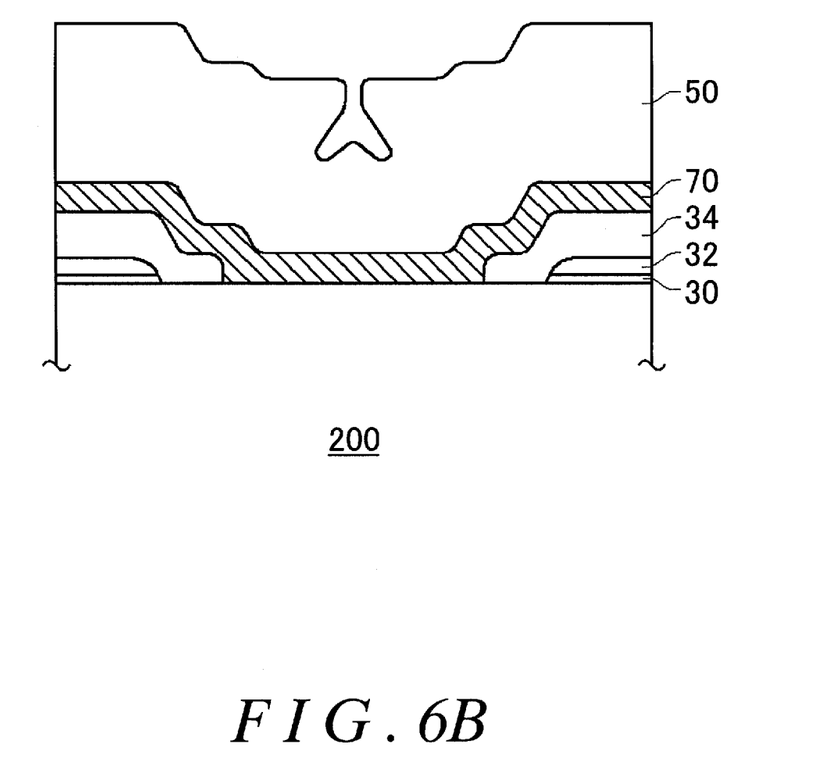
FIG. 6B is a schematic view showing the shape of the electrode layer 50 of the semiconductor device 200.

FIG. 6B is a schematic view showing the shape of the electrode layer 50 of the semiconductor device 200. In FIG. 6B, the titanium nitride layer 40, the nickel layer 42, and the hydrogen absorbing layer 44 are collectively referred to as the metal layer 70. The semiconductor device 200 does not include the nitride layer 46, and therefore the electrode layer 50 cannot be formed at a high temperature. As a result, the coverage of the electrode layer 50 is worsened and a large depression occurs in the top surface. When a plating liquid or the like enters into this depression, the effect of the ions included in the plating liquid causes fluctuation in the characteristics such as threshold values of the semiconductor device 100.

Figure 7:
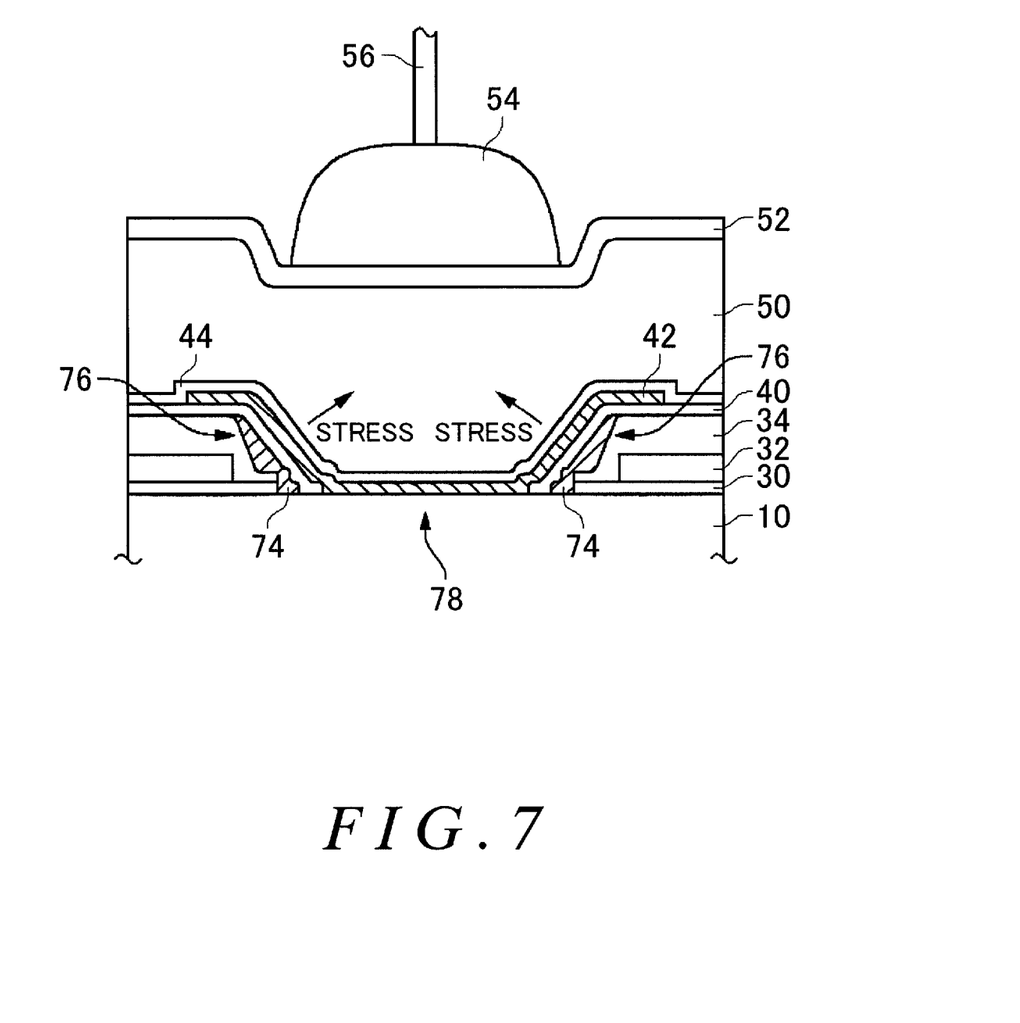
FIG. 7 shows peeling of the metal layer in the semiconductor device 200.

FIG. 7 shows peeling of the metal layer in the semiconductor device 200. As described above, stress causing the inward contraction occurs in the electrode layer 50 opposite the solder layer 54 due to the difference in thermal expansion coefficients between the solder layer 54 and the electrode layer 50. Therefore, the titanium nitride layer 40 and the like peel away and create empty spaces 74 on the side surfaces 76 of the interlayer insulating film 34 and the top surface 78 of the semiconductor layer, for example. When protective resin, plating liquid, or the like enters into these empty spaces 74, the ions included in the resin or the like cause fluctuation in characteristics such as threshold values of the semiconductor device 100. In contrast, by providing the alloy layer 48, the semiconductor device 100 can restrict peeling of the titanium nitride layer 40 and the like.

Furthermore, gate voltages of +3 MV/cm and −3 MV/cm were each applied to the semiconductor device 200 for 10 minutes in an environment with a temperature of 200 degrees Celsius, and the fluctuation of the threshold voltage for each case was measured. After the gate voltage of +3 MV/cm was applied, the shift amount of the threshold voltage was less than or equal to 0.1 V. However, after the gate voltage of −3 MV/cm was applied, the threshold voltage exhibited a large shift in the negative direction.

These results show that applying a large negative gate voltage in a high-temperature environment causes a positive fixed charge in the gate insulating film 30 or near the boundary plane between the gate insulating film 30 and the semiconductor layer made of SiC or the like. This fixed charge is believed to be caused by the electrode layer 50 made of aluminum.

The same test was also performed on the semiconductor device 100. After the gate voltage of +3 MV/cm and the gate voltage of −3 MV/cm were applied, the fluctuation of the threshold voltages was less than or equal to 0.1 V in each case. In this way, the semiconductor device 100 is able to restrict the fluctuation of the threshold voltage.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: semiconductor substrate, 12: first electrode layer, 14: second electrode layer, 16: drift layer, 18: well region, 20: source region, 21: drift region, 22: base layer, 24: contact region, 30: gate insulating film, 32: gate electrode, 34: interlayer insulating film, 36: silicide region, 40: titanium nitride layer, 42: nickel layer, 44: hydrogen absorbing layer, 46: nitride layer, 47: precursor layer, 48: alloy layer, 50: electrode layer, 52: plating layer, 54: solder layer, 56: apertures or pins, 60: metal layer, 70: metal layer, 74: empty space, 76: side surface, 78: top surface, 100: semiconductor device, 110: edge termination structure, 120: active region, 130: gate pad, 200: semiconductor device

What is claimed is:
1. A semiconductor device comprising:
a semiconductor substrate;
a hydrogen absorbing layer that is provided above a top surface of the semiconductor substrate and formed of a first metal having a hydrogen absorbing property;
a nitride layer that is provided above the hydrogen absorbing layer and formed of a nitride of the first metal;
an alloy layer that is provided above the nitride layer and formed of an alloy of aluminum and a second metal; and
an electrode layer that is provided above the alloy layer and formed of aluminum, wherein
a pure metal layer of the second metal is not provided between the electrode layer and the nitride layer.
2. The semiconductor device according to claim 1, wherein
the first metal is titanium.
3. The semiconductor device according to claim 1, wherein
the second metal is one of titanium, molybdenum, tungsten, vanadium, chromium, copper, and nickel.
4. The semiconductor device according to claim 3, wherein
the second metal is titanium.
5. The semiconductor device according to claim 1, wherein
thickness of the alloy layer is greater than or equal to 15 nm.
6. The semiconductor device according to claim 5, wherein
the thickness of the alloy layer is less than or equal to 0.5 μm.
7. The semiconductor device according to claim 1, wherein
thickness of the electrode layer is less than or equal to 3 μm.
8. The semiconductor device according to claim 7, wherein
the thickness of the electrode layer is greater than or equal to 1 μm and less than or equal to 2 μm.
9. The semiconductor device according to claim 1, further comprising:
a solder layer provided above the electrode layer.
10. The semiconductor device according to claim 9, wherein
the alloy layer is formed at least in a region opposite the solder layer.
11. The semiconductor device according to claim 1, further comprising:
an interlayer insulating film that is provided above a top surface of the semiconductor substrate, wherein
an opening that exposes a source region formed on the top surface of the semiconductor substrate is formed in the interlayer insulating film, and
the hydrogen absorbing layer, the nitride layer, and the alloy layer are formed at least above the opening of the interlayer insulating film.
12. The semiconductor device according to claim 11, wherein
the hydrogen absorbing layer, the nitride layer, and the alloy layer are also formed in a region along side surfaces of the opening of the interlayer insulating film.
13. The semiconductor device according to claim 1, wherein
the semiconductor substrate is a silicon carbide substrate.
14. A semiconductor device manufacturing method comprising:
forming a hydrogen absorbing layer that is formed of a first metal having a hydrogen absorbing property above a top surface of a semiconductor substrate;
forming a nitride layer that is formed of a nitride of the first metal above the hydrogen absorbing layer;

forming a precursor layer that is formed of a second metal above the nitride layer; and forming an alloy layer by forming the aluminum on the precursor layer so as to cause all of the precursor layer to become an alloy with aluminum, and forming an electrode layer made of aluminum on the alloy layer.

15. The semiconductor device manufacturing method according to claim 14, wherein the aluminum is formed at a temperature greater than or equal to 200 degrees Celsius.

* * * * *